United States Patent
Shen (10) Patent No.: US 7,737,797 B2
(45) Date of Patent: Jun. 15, 2010

(54) CONTROLLABLE OSCILLATING SYSTEM AND RELATED METHOD FOR SELECTIVELY ADJUSTING CURRENTS PASSING THROUGH CROSS-COUPLING DRIVING DEVICE

(75) Inventor: Chih-Hsien Shen, Kao-Hsiung (TW)

(73) Assignee: Mediatek Inc., Hsin-Chu (TW)

( * ) Notice: Subject to any disclaimer, the term of this patent is extended or adjusted under 35 U.S.C. 154(b) by 90 days.

(21) Appl. No.: 11/936,780

(22) Filed: Nov. 7, 2007

(65) Prior Publication Data
US 2009/0115540 A1    May 7, 2009

(51) Int. Cl.
*H03K 3/282* (2006.01)
*H03B 5/08* (2006.01)

(52) U.S. Cl. .................... 331/117 R; 331/117 FE; 331/167; 331/182; 331/185; 331/186

(58) Field of Classification Search ........... 327/359, 327/291; 331/36 C, 36 L, 36 R, 16, 34, 117 R, 331/117 FE, 167, 177 R, 177 V, 185, 186, 331/187, 182
See application file for complete search history.

(56) References Cited

U.S. PATENT DOCUMENTS

| | | | |
|---|---|---|---|
| 6,281,758 B1 * | 8/2001 | Elsayed et al. ............... 331/16 |
| 6,750,727 B1 | 6/2004 | Sutardja | |
| 6,954,088 B2 * | 10/2005 | Masenas ..................... 327/101 |
| 6,987,425 B1 | 1/2006 | Sutardja | |
| 6,995,624 B2 * | 2/2006 | Vanselow ............... 331/117 R |
| 7,164,325 B2 * | 1/2007 | Aparin et al. ............... 331/176 |
| 2003/0025566 A1 * | 2/2003 | Rogers ....................... 331/109 |
| 2003/0231072 A1 * | 12/2003 | Mason .................... 331/117 R |
| 2005/0164671 A1 | 7/2005 | Darabi | |
| 2006/0132253 A1 * | 6/2006 | Gelhausen et al. .......... 331/167 |
| 2007/0182502 A1 * | 8/2007 | Shin et al. .................... 331/167 |
| 2008/0042766 A1 * | 2/2008 | Tarng et al. ................. 331/167 |
| 2008/0246548 A1 * | 10/2008 | Fagg et al. .................. 331/132 |

* cited by examiner

*Primary Examiner*—Arnold Kinkead
*Assistant Examiner*—Richard Tan
(74) *Attorney, Agent, or Firm*—Winston Hsu (57) ABSTRACT

A controllable oscillating system for generating a differential oscillating signal is disclosed. The controllable oscillating system includes an oscillating circuit and a current adjusting device. The oscillating circuit includes a controllable resonator, a cross-coupling driving device, and a current source. The cross-coupling driving device is coupled to the controllable resonator and utilized for driving the controllable resonator to generate the differential oscillating signal. The current source is coupled to the cross-coupling driving device and utilized for providing a first current. The current adjusting device is coupled to the cross-coupling driving device and utilized for adjusting currents passing through the cross-coupling driving device.

21 Claims, 9 Drawing Sheets

CONTROLLABLE OSCILLATING SYSTEM AND RELATED METHOD FOR SELECTIVELY ADJUSTING CURRENTS PASSING THROUGH CROSS-COUPLING DRIVING DEVICE

BACKGROUND

The present invention relates to a controllable oscillating system, and more particularly, to a controllable oscillating system and related method for generating a differential oscillating signal.

In general, in a radio frequency (RF) communication application, an oscillating circuit (e.g. a transmitting master oscillator or a receiving local oscillator) is required for generating a differential oscillating signal for signal transmission or signal reception. A primary performance criterion of the oscillating circuit is the phase noise characteristic. An oscillating circuit with a lower phase noise means that the oscillating circuit produces less spurious signals outside a desired fundamental frequency signal. The phase noise results from a low frequency noise existing in active elements in the oscillating circuit. For example, active elements in an LC oscillating circuit are primarily transistors included within a cross-coupling driving device in the LC oscillating circuit. This low frequency noise is commonly referred to as flicker noise and up converted to the desired fundamental frequency signal. Thus, the phase noise arises.

Figure 1:
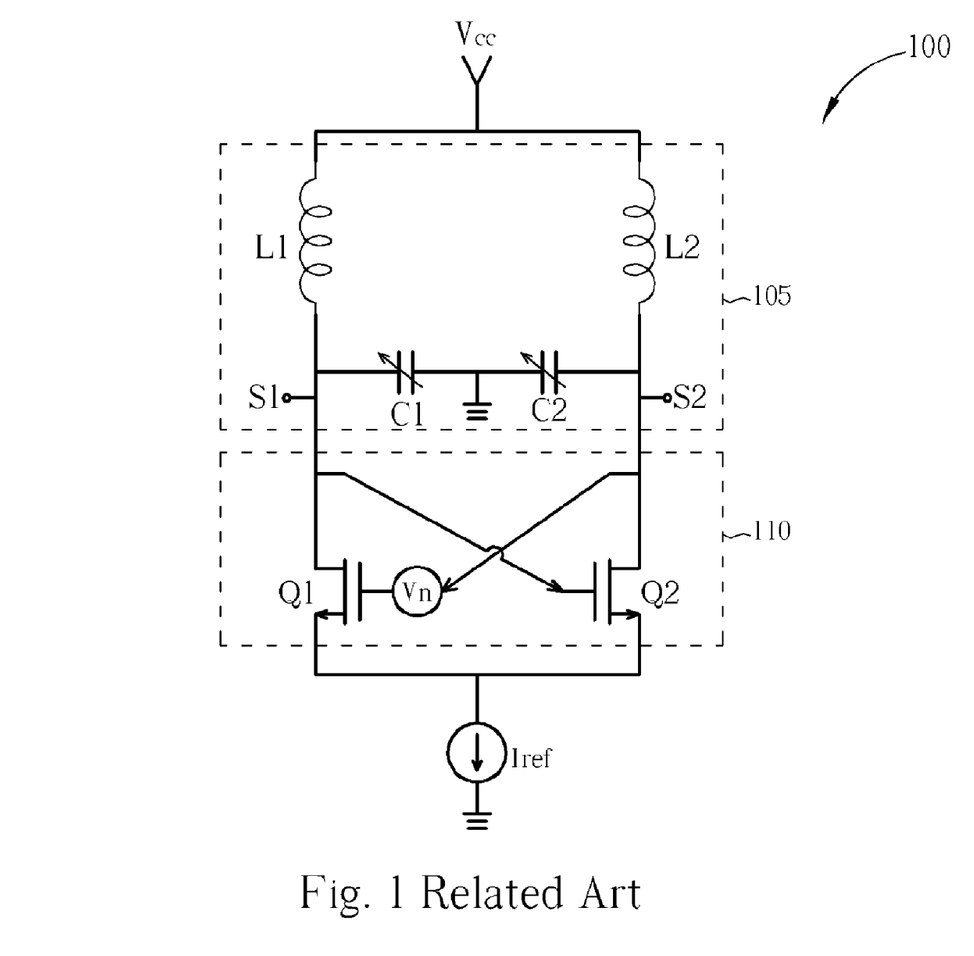
FIG. 1 is a schematic diagram of a conventional oscillating circuit.
Figure 2:
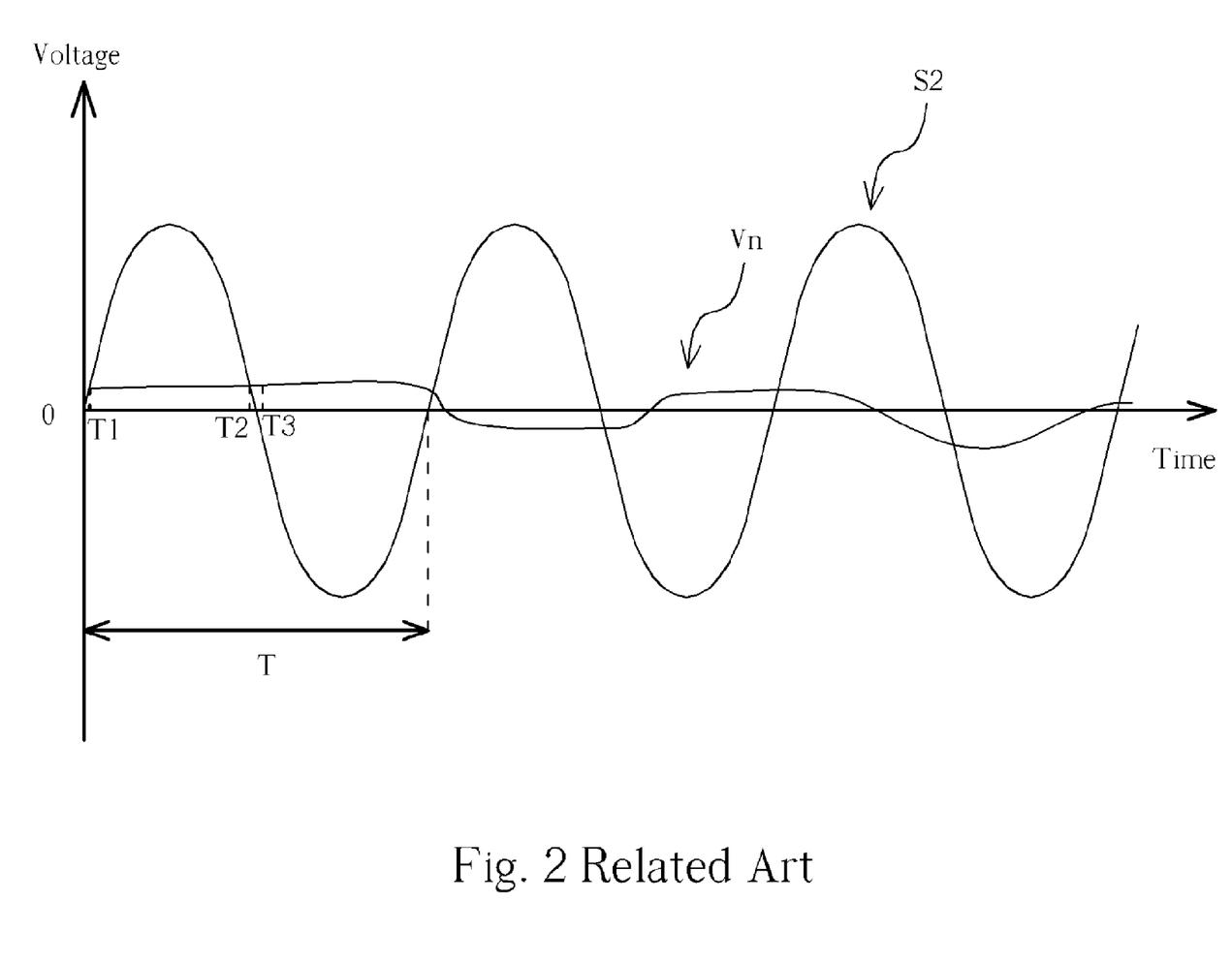
FIG. 2 shows possible practical voltage waveforms of the oscillating signal and the voltage source modeled by the phase noise shown in FIG. 1.

FIG. 1 is a schematic diagram of a conventional oscillating circuit 100. As shown in FIG. 1, the oscillating circuit 100 comprises a controllable resonator 105, a cross-coupling driving device 110, and a current source 115 for providing a reference current Iref. The controllable resonator 105 (also called an LC resonator) is formed by capacitors C1 and C2 and inductors L1 and L2. The cross-coupling driving device 110 is formed by NMOS transistors Q1 and Q2 and is utilized for generating a differential oscillating signal composed of oscillating signals S1 and S2. Ideally, only one of the NMOS transistors Q1 and Q2 is turned on at a time. That is, the NMOS transistors Q1 and Q2 should not be conductive simultaneously. However, in practice, both the NMOS transistors Q1 and Q2 may be turned on due to the flicker noise as described above. For simplifying the discussion, it is assumed that only the phase noise resulting from the NMOS transistor Q1 of the cross-coupling driving device 110 is considered and the phase noise could be modeled as a small voltage source Vn at the gate of the NMOS transistor Q1. Please refer to FIG. 2. FIG. 2 shows possible practical voltage waveforms of the oscillating signal S2 and the voltage source Vn shown in FIG. 1. The voltage source Vn resulting from the phase noise may cause the NMOS transistor Q1 to turn on early or late, depending upon the timing when the sum of the voltage source Vn and oscillating signal S2 is higher or lower than a threshold voltage of the NMOS transistor Q1. That is, during each transition time, both the NMOS transistors Q1 and Q2 may be turned on. This problem will become more serious if both the phase noise resulting from the NMOS transistors Q1 and Q2 are considered at the same time.

One of the conventional solutions is to utilize an attenuating device to eliminate the phase noise. The attenuating device is utilized for reducing the feedback gain of the active elements for amplifying signals having frequencies much less than that of the desired fundamental frequency signal. Thus, the amplified low frequency noise can be suppressed. A full description is disclosed in U.S. Pat. No. 6,750,727B1 and U.S. Pat. No. 6,987,425B1, and further details are omitted here for brevity.

SUMMARY

One of the objectives of the present invention is to provide a controllable oscillating system capable of adjusting currents passing through the cross-coupling driving device in the oscillating circuit, to reduce the phase noise.

According to an embodiment of the present invention, a controllable oscillating system utilized for generating a differential oscillating signal is disclosed. The controllable oscillating system comprises an oscillating circuit and a current adjusting device. The oscillating circuit comprises a controllable resonator, a cross-coupling driving device, and a current source. The cross-coupling driving device is coupled to the controllable resonator and utilized for driving the controllable resonator to generate the differential oscillating signal. The current source is coupled to the cross-coupling driving device and utilized for providing a first current. The current adjusting device is coupled to the cross-coupling driving device and utilized for adjusting currents passing through the cross-coupling driving device.

According to the embodiment of the present invention, a method for generating a differential oscillating signal is further disclosed. The method comprises: providing an oscillating circuit having a controllable resonator, a cross-coupling driving device, and a current source; and adjusting currents passing through the cross-coupling driving device. The cross-coupling driving device is coupled to the controllable resonator and utilized for driving the controllable resonator to generate the differential oscillating signal. The current source is coupled to the cross-coupling driving device and utilized for providing a first current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

While the implementation of the present invention is not hindered, in the following description of the present invention, it is assumed that a noise energy caused by the voltage source Vn is considered significant before the absolute value of a level of the oscillating signal S2 exceeds that of a level of the voltage source Vn, and the noise energy can be considered to be omitted after the absolute value of the level of the oscillating signal S2 exceeds that of the level of the voltage source Vn. Additionally, since the slope value S of the oscillating signal S2 before the absolute value exceeds that of the voltage source Vn (e.g. during a period 0~T1 shown in FIG. 2) can be regarded as an approximately fixed value, the slope value S is assumed fixed in an exemplary embodiment of the present invention. An output noise current Ion corresponding to the phase noise can be regarded as a function of a twice current I' caused by the voltage source Vn (the current I' will be switched from one direction to an opposite direction during the transition time), being multiplied by a ratio of a time interval to the period T of the oscillating signal S2. The time interval is an interval (e.g. a time interval T2~T3) where the absolute value of the level of the oscillating signal S2 is lower than that of the level of the voltage source Vn. Thus, the output noise current Ion is determined by the following equation:

$$\text{Ion} = 2 \times I' \times \frac{\frac{Vn}{S}}{\frac{T}{2}} = 4 \times I' \times \frac{Vn}{S \times T}, \quad \text{Equation (1)}$$

As mentioned above, if the oscillating signal S2 is an ideal square wave, the phase noise will approximate to zero. The reason is that a slope value of each transition edge of the ideal square wave is almost infinite and the output noise current Ion almost approximates to zero. Thus the phase noise is reduced. In practice, however, it is very difficult to produce an ideal square wave by any well-known oscillating circuits. Accordingly, an embodiment of the present invention provides a controllable oscillating system capable of reducing the current I' caused by the voltage source Vn during each transition time by means of dynamically adjusting currents passing through the cross-coupling driving device in the oscillating circuit.

Figure 3:
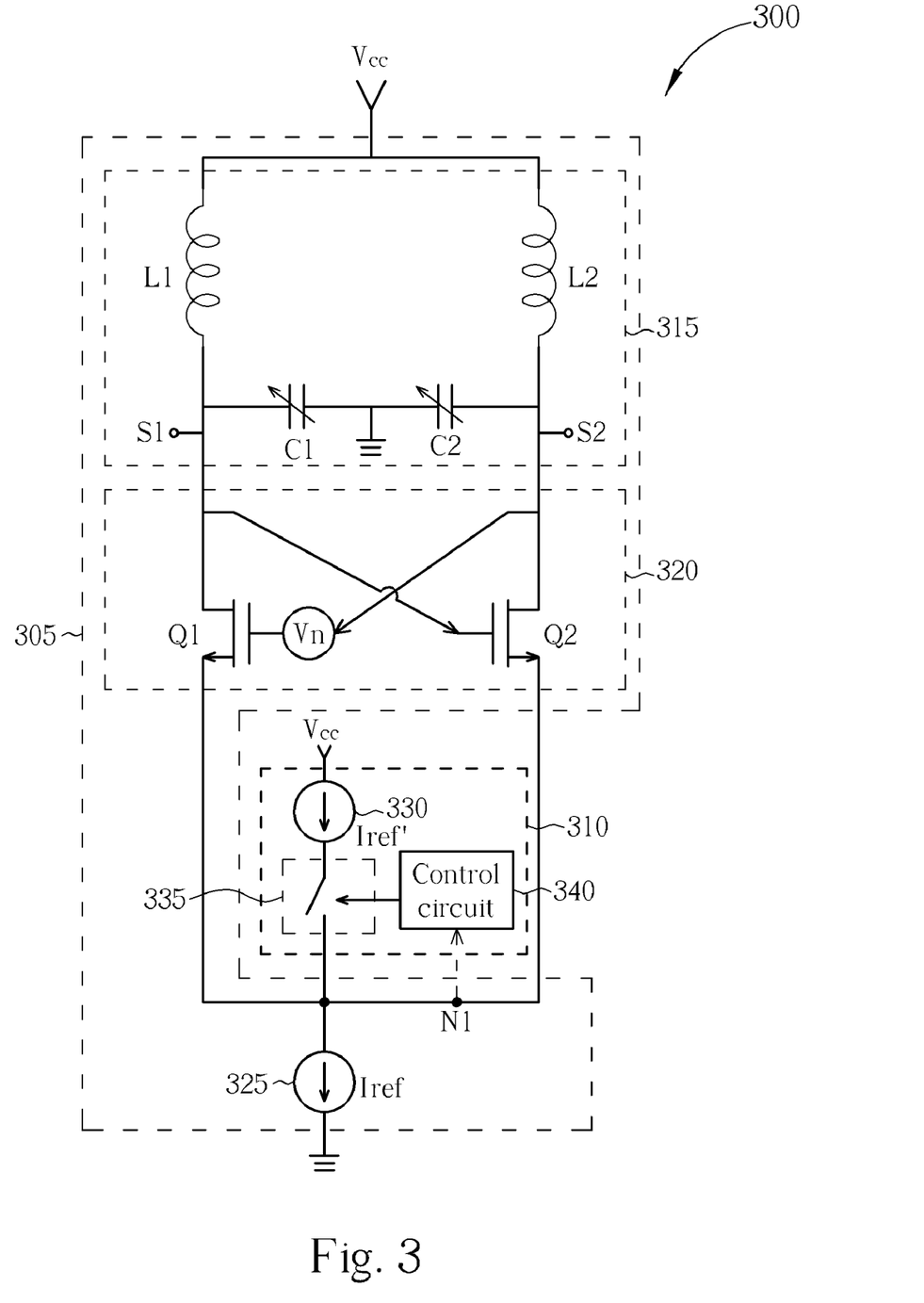
FIG. 3 is a schematic diagram of a controllable oscillating system according to a first embodiment of the present invention.
Figure 4:
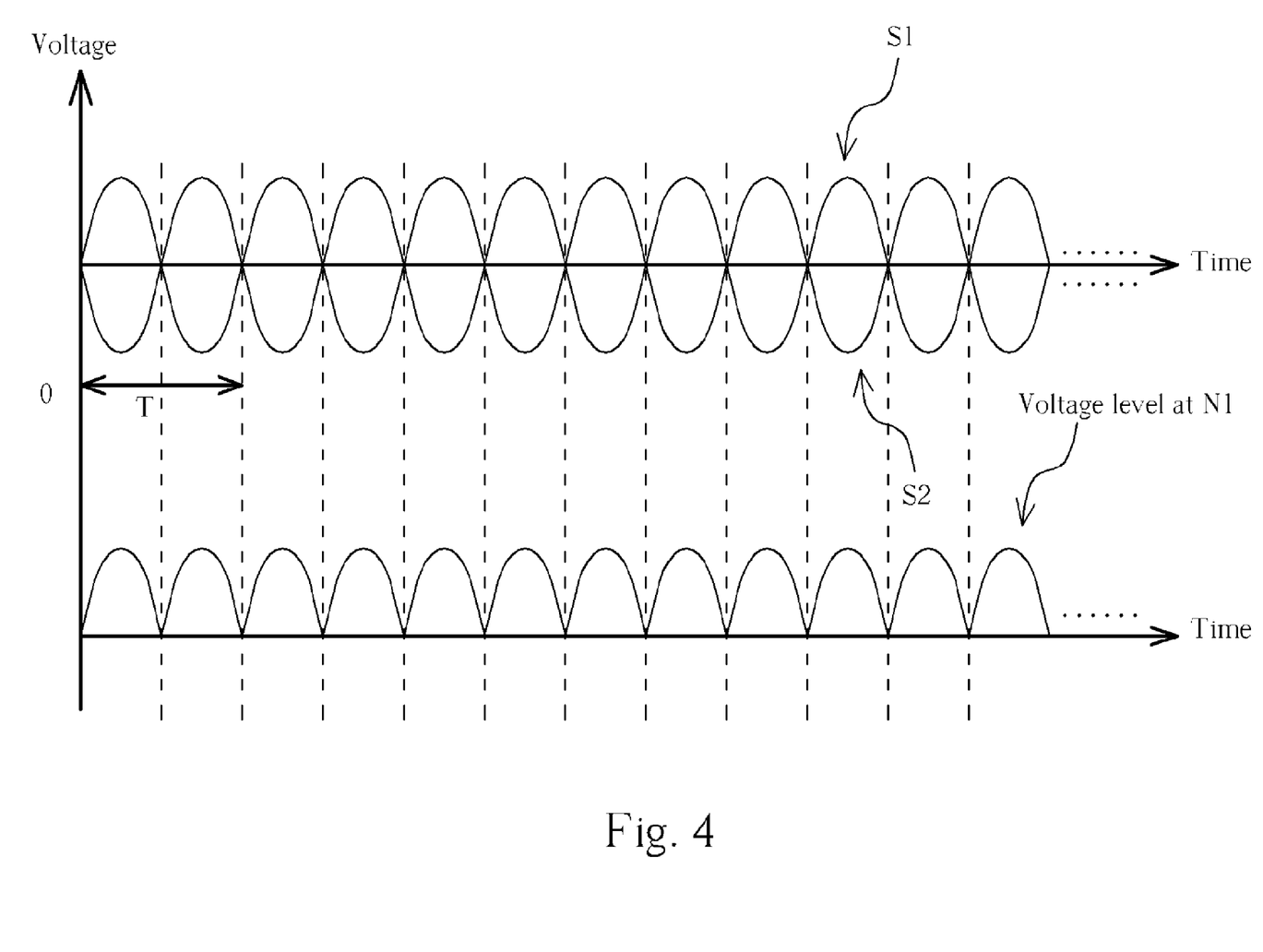
FIG. 4 plots the voltage waveforms of the oscillating signals and the waveform of the voltage level at node N1 of the controllable oscillating system shown in FIG. 3.

Please refer to FIG. 3. FIG. 3 is a schematic diagram of a controllable oscillating system 300 according to a first embodiment of the present invention. As shown in FIG. 3, the controllable oscillating system 300 comprises an oscillating circuit 305 and a current adjusting device 310. The oscillating circuit 305 comprises a controllable resonator 315, a cross-coupling driving device 320, and a current source 325. The current adjusting device 310 is formed by a current source 330 for providing a current Iref', a switch 335, and a control circuit 340. The operations and functions of the controllable resonator 315, the cross-coupling driving device 320, and the current source 325 are identical to those of the controllable resonator 105, the cross-coupling driving device 110, and the current source 115; further description is not detailed for brevity. The current adjusting device 310 is utilized for selectively adjusting currents passing through the NMOS transistors Q1 and Q2 of the cross-coupling driving device 320 according to the voltage level at a node N1 shown in FIG. 3, where the voltage level at the node N1 corresponds to the differential oscillating signal formed by the oscillating signals S1 and S2. The operation of the current adjusting device 310 is accomplished by utilizing the control circuit 340 to control a status (on/off) of the switch 335 to selectively inject the current Iref' through the node N1 into the current source 325 for dynamically adjusting the currents passing through the NMOS transistors Q1 and Q2 according to a waveform of the voltage level at the node N1 of the controllable oscillating system 300. The waveform of the voltage level at the node N1 of the controllable oscillating system 300 is shown in FIG. 4. It should be noted that the current Iref' provided by the current source 330 is not limited to be fixed. The current Iref', for example, can be configured to depend on the voltage level at the node N1.

Please refer to FIG. 4. FIG. 4 illustrates the voltage waveforms of the oscillating signals S1 and S2 and the waveform of the voltage level at the node N1 of the controllable oscillating system 300 shown in FIG. 3. As shown in FIG. 4, when the voltage waveforms of the oscillating signals S1 and S2 cross zero during each transition time, the voltage level at the node N1 also becomes approximately zero. Therefore, the voltage level of the node N1 can be utilized for determining when the current adjusting device 310 injects the current Iref' into the current source 325 and when the current adjusting device 310 stops injecting the current Iref' into the current source 325. If the voltage level at the node N1 falls in a predetermined range (e.g. 0~+V1, where V1 is a value smaller than Vcc and higher than zero), the current adjusting device 310 injects the current Iref' into the current source 325; otherwise, the current adjusting device 310 stops injecting the current Iref' into the current source 325. When the voltage level at the node N1 falls in the predetermined range, since the current Iref' is injected into the current source 325, the currents passing through the NMOS transistors Q1 and Q2 become relatively small. Accordingly, the current I' caused by the voltage source Vn also becomes smaller, and the output noise current Ion is decreased (i.e. the phase noise is diminished or eliminated).

Figure 5:
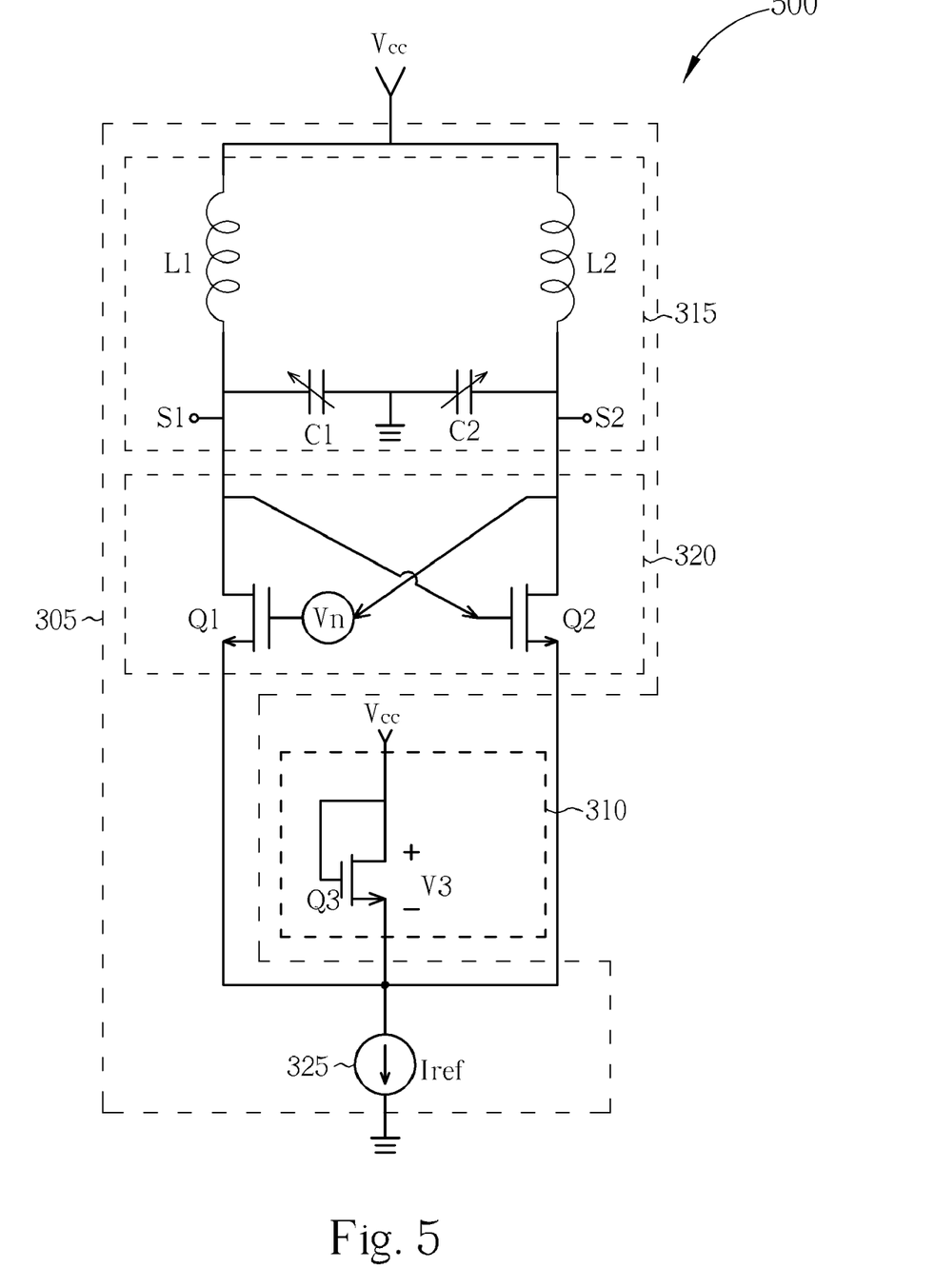
FIG. 5 is a schematic diagram of a controllable oscillating system according to a second embodiment of the present invention.

The operation and function of the current adjusting device 310 can be accomplished by an NMOS transistor. Please refer to FIG. 5. FIG. 5 is a schematic diagram of a controllable oscillating system 500 according to a second embodiment of the present invention. Since the gate and drain of the NMOS transistor Q3 are coupled, the NMOS transistor Q3 biased in the saturation region is always turned on, and a current provided by the voltage supply level Vcc is injected into the current source 325 through the NMOS transistor Q3 only if the voltage drop V3 does not become lower than the threshold voltage of the NMOS transistor Q3. That is, in this embodiment, the predetermined range is from zero to the threshold voltage of the NMOS transistor Q3. It should be noted that the NMOS transistor Q3 is not meant to be a limitation of the present invention. It will be obvious to those skilled in the art to utilize other type transistors (e.g. PMOS transistors), diodes, or other electronic elements for dynamically injecting a current into the current source 325.

Figure 6:
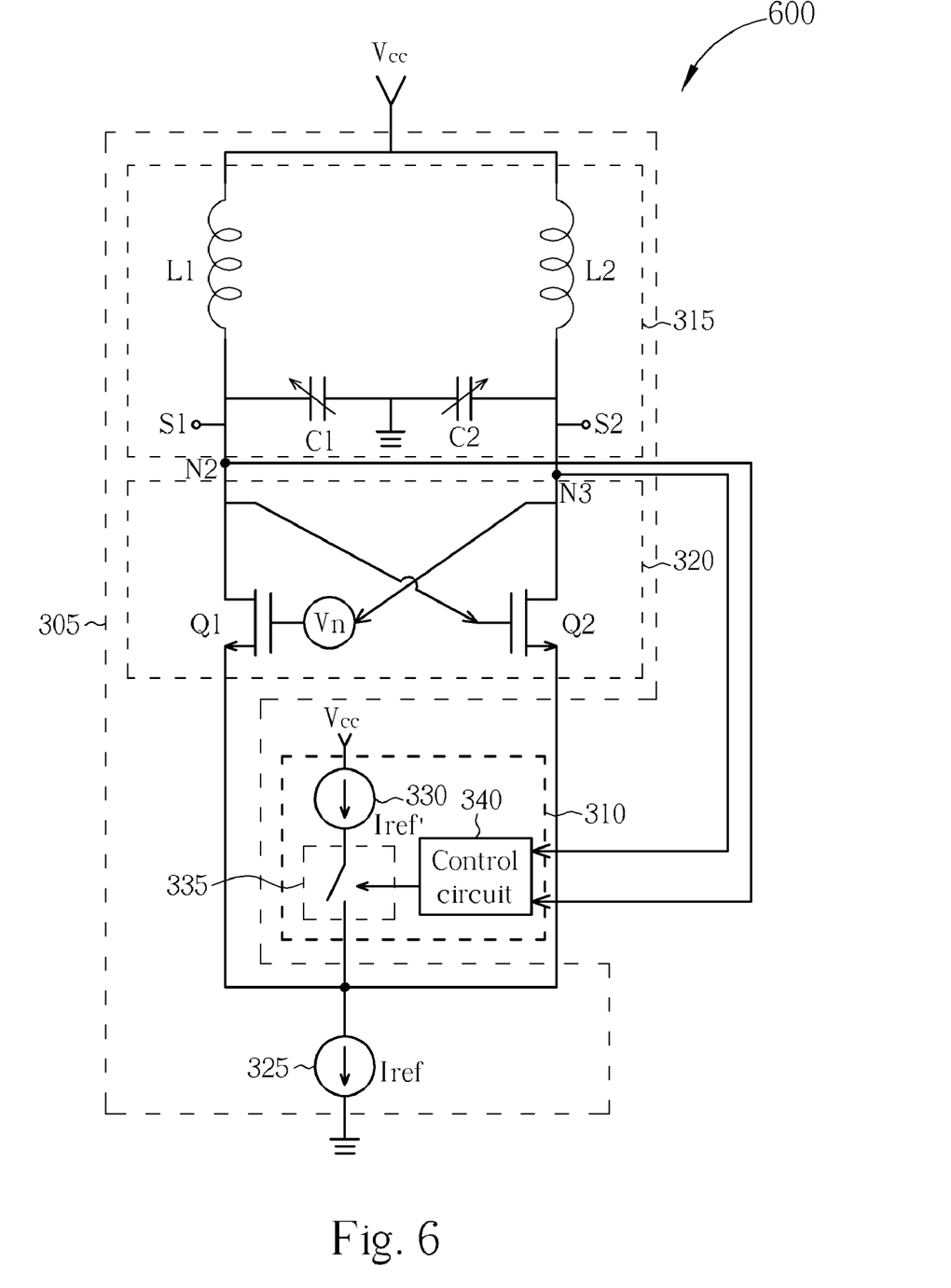
FIG. 6 is a schematic diagram of a controllable oscillating system according to a third embodiment of the present invention.

In addition, the current adjusting device 310 of FIG. 3 can also dynamically adjust the currents passing through the NMOS transistors Q1 and Q2 by utilizing the control circuit 340 to detect the voltage waveforms of the oscillating signals S1 and S2 (i.e. waveforms of the voltage levels at connecting nodes N2 and N3 of the controllable resonator 315 and cross-coupling driving device 320). Please refer to FIG. 6. FIG. 6 is a schematic diagram of a controllable oscillating system 600 according to a third embodiment of the present invention. As shown in FIG. 6, the control circuit 340 is configured to detect the waveforms of the voltage levels at the nodes N2 and N3 and then detect a difference between waveforms of the voltage levels at the nodes N2 and N3, where the waveform of the difference is similar to the voltage level at the node N1 shown in FIG. 4. However, this is not intended to be a limitation of the present invention. Other schemes for detecting the voltage levels at the nodes N2 and N3 are also suitable for the present invention.

Figure 7:
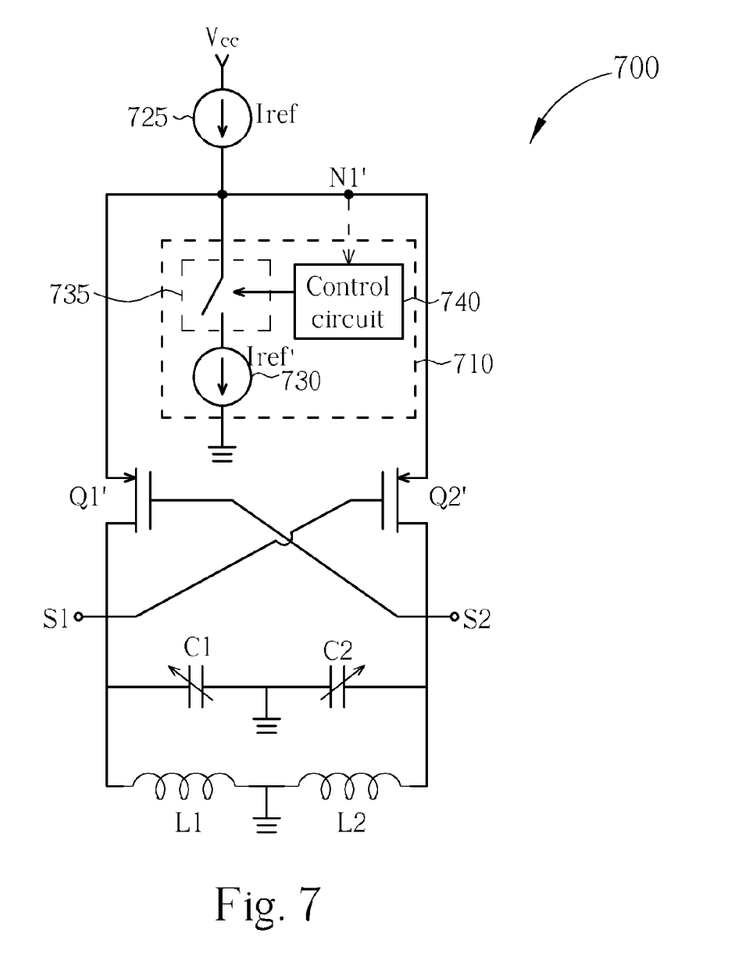
FIG. 7 is a schematic diagram of a controllable oscillating system according to a fourth embodiment of the present invention.

Additionally, it will be obvious to those skilled in the art to replace the NMOS transistors Q1 and Q2 of FIG. 3 with PMOS transistors with some appropriate changes to the voltage supply level Vcc and the ground level. Please refer to FIG. 7. FIG. 7 is a schematic diagram of a controllable oscillating system 700 according to a fourth embodiment of the present invention. As shown in FIG. 7, the current adjusting device 710 is utilized for selectively sinking the current Iref' from the current source 725 by using a current source 730, a switch 735, and a control circuit 740 according to a waveform of the voltage level at a node N1' of the controllable oscillating system 700, to dynamically adjust the currents passing through PMOS transistors Q1' and Q2'. The operation of the control circuit 740 is similar to that of the control circuit 340, and is not detailed here for brevity. Of course, as would be readily appreciated by one skilled in the art, in another embodiment of the present invention the current adjusting device 710 can also selectively sink the current Iref' from the current source 725 according to waveforms of the oscillating signals S1 and S2. This also falls in the scope of the present invention.

Figure 8:
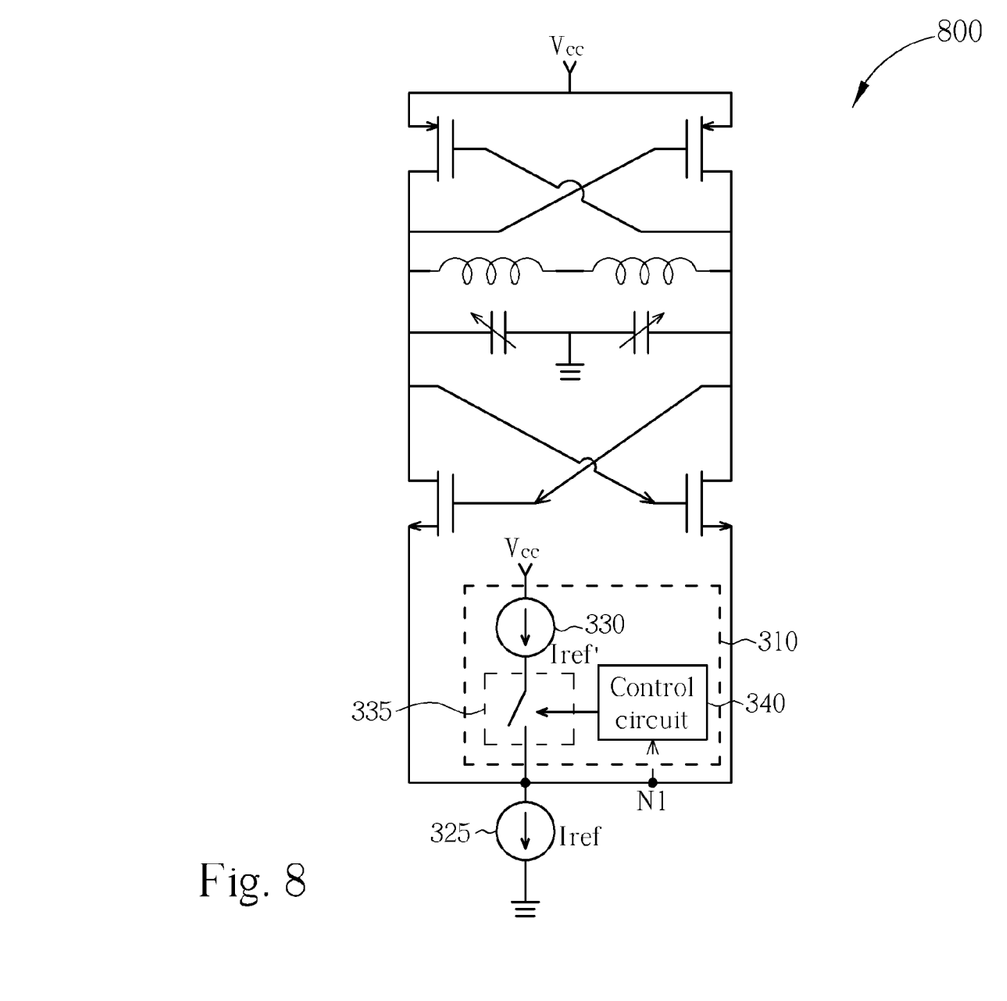
FIG. 8 is a schematic diagram of a controllable oscillating system according to a fifth embodiment of the present invention.
Figure 9:
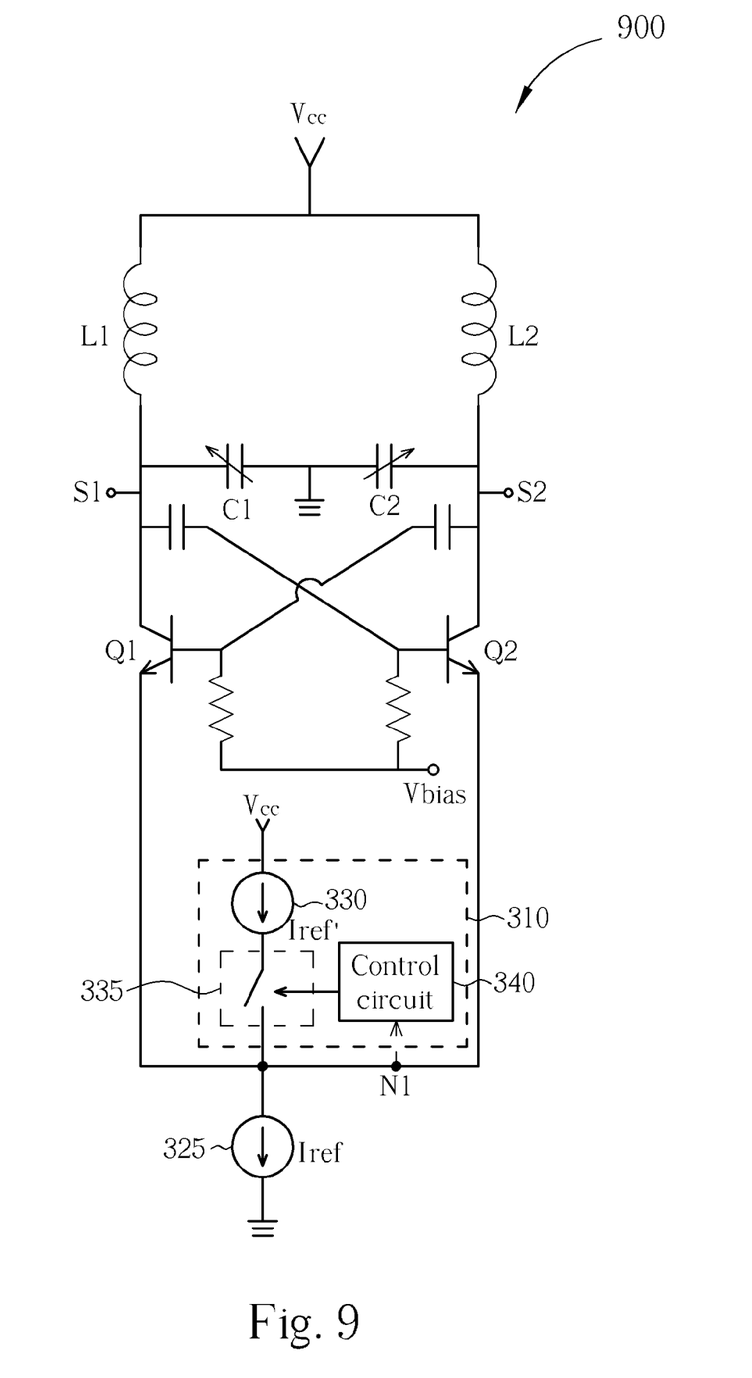
FIG. 9 is a schematic diagram of a controllable oscillating system according to a sixth embodiment of the present invention.

Furthermore, the current adjusting device 300 of FIG. 3 or the current adjusting device 700 of FIG. 7 can be applied to other types of LC controllable oscillating systems. For example, the current adjusting device 300 of FIG. 3 can be applied into a Complementary MOS (CMOS) based LC controllable oscillating system 800 shown in FIG. 8, or into a BJT based LC controllable oscillating system 900 shown in FIG. 9. After reading the above disclosure, a person skilled in the art can readily appreciate that other circuit configurations are possible in reference to the above embodiments shown in FIG. 3, FIG. 7, FIG. 8, and FIG. 9. The alternative designs obeying the spirit of the present invention all fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A controllable oscillating system for generating a differential oscillating signal, comprising:
an oscillating circuit, comprising:
a controllable resonator;
a cross-coupling driving device, coupled to the controllable resonator, for driving the controllable resonator to generate the differential oscillating signal; and
a current source, coupled to the cross-coupling driving device, for providing a first current; and
a current adjusting device, coupled to the cross-coupling driving device, for selectively adjusting currents passing through the cross-coupling driving device according to at least a specific voltage level corresponding to the differential oscillating signal, wherein the current adjusting device is arranged to adjust the currents passing through the cross-coupling driving device when the specific voltage level falls in a predetermined range, and stop adjusting the currents when the specific voltage level does not fall in the predetermined range; and the predetermined range is between a first reference value and a second reference value lower than the first reference value.

2. The controllable oscillating system of claim 1, being an LC-tank voltage controlled oscillator (VCO), wherein the controllable resonator is an LC resonator.

3. The controllable oscillating system of claim 1, wherein the current adjusting device is coupled to the current source for selectively injecting a second current into the current source according to the specific voltage level.

4. The controllable oscillating system of claim 3, wherein the current adjusting device injects the second current into the current source when the specific voltage level falls in the predetermined range, and stops injecting the second current into the current source when the specific voltage level does not fall in the predetermined range.

5. The controllable oscillating system of claim 4, wherein the specific voltage is a voltage level at one end of the current source.

6. The controllable oscillating system of claim 4, wherein the current adjusting device selectively adjusts current passing through the cross-coupling driving device according to a plurality of specific voltage levels corresponding to the differential oscillating signal; and the specific voltage levels are voltage levels at a plurality of connecting nodes of the controllable resonator and the cross-coupling driving device.

7. The controllable oscillating system of claim 3, wherein the specific voltage is at second ends of a first transistor and a second transistor, and the current adjusting device comprises:
a third transistor, having a first end and a control end coupled to a predetermined voltage level, and a second end coupled to the current source.

8. The controllable oscillating system of claim 1, wherein the current adjusting device is coupled to the current source for selectively sinking a second current from the current source according to the specific voltage level.

9. The controllable oscillating system of claim 8, wherein the current adjusting device sinks the second current from the current source when the specific voltage level falls in the predetermined range, and stops sinking the second current from the current source when the specific voltage level does not fall in the predetermined range.

10. The controllable oscillating system of claim 9, wherein the specific voltage level is a voltage level at one end of the current source.

11. The controllable oscillating system of claim 8, wherein the current adjusting device selectively adjusts current passing through the cross-coupling driving device according to a plurality of specific voltage levels corresponding to the differential oscillating signal; and the specific voltage levels are voltage levels at a plurality of connecting nodes of the controllable resonator and the cross-coupling driving device.

12. The controllable oscillating system of claim 8, wherein the specific voltage is at second ends of a first transistor and a second transistor, and the current adjusting device comprises:

a third transistor, having a first end and a control end coupled to a predetermined voltage level, and a second end coupled to the current source.

13. A method for generating a differential oscillating signal, comprising:
providing an oscillating circuit, comprising:
a controllable resonator;
a cross-coupling driving device, coupled to the controllable resonator, for driving the controllable resonator to generate the differential oscillating signal; and
a current source, coupled to the cross-coupling driving device, for providing a first current; and
selectively adjusting currents passing through the cross-coupling driving device according to at least a specific voltage level corresponding to the differential oscillating signal, comprising:
when the specific voltage level falls in a predetermined range, adjusting the currents passing through the cross-coupling driving device; and
when the specific voltage level does not fall in the predetermined range, stopping adjusting the currents;
wherein the predetermined range is between a first reference value and a second reference value lower than the first reference value.

14. The method of claim 13, wherein the step of selectively adjusting currents passing through the cross-coupling driving device according to the specific voltage level comprises:
selectively injecting a second current into the current source according to the specific voltage level.

15. The method of claim 14, wherein the step of selectively injecting the second current into the current source current comprises:
injecting the second current into the current source when the specific voltage level falls in the predetermined range; and
stopping injecting the second current into the current source when the specific voltage level does not fall in the predetermined range.

16. The method of claim 15, wherein the specific voltage is a voltage level at one end of the current source.

17. The method of claim 15, wherein the step of selectively adjusting currents passing through the cross-coupling driving device according to at least a specific voltage level corresponding to the differential oscillating signal comprises:
selectively adjusting currents passing through the cross-coupling driving device according to a plurality of specific voltage levels corresponding to the differential oscillating signal; wherein the specific voltage levels are voltage levels at a plurality of connecting nodes of the controllable resonator and the cross-coupling driving device.

18. The method of claim 13, wherein the step of selectively adjusting currents passing through the cross-coupling driving device according to the specific voltage level comprises:
selectively sinking a second current from the current source according to the specific voltage level.

19. The method of claim 18, wherein the step of selectively sinking the second current from the current source comprises:
sinking the second current from the current source when the specific voltage level falls in the predetermined range; and
stopping sinking the second current from the current source when the specific voltage level does not fall in the predetermined range.

20. The method of claim 19, wherein the specific voltage is a voltage level at one end of the current source.

21. The method of claim 19, wherein the step of selectively adjusting currents passing through the cross-coupling driving device according to at least a specific voltage level corresponding to the differential oscillating signal comprises:
selectively adjusting currents passing through the cross-coupling driving device according to a plurality of specific voltage levels corresponding to the differential oscillating signal; wherein the specific voltage levels are voltage levels at a plurality of connecting nodes of the controllable resonator and the cross-coupling driving device.

* * * * *